(12) United States Patent
Nakamura (10) Patent No.: US 9,635,754 B2
(45) Date of Patent: Apr. 25, 2017

(54) CIRCUIT ASSEMBLY

(71) Applicant: Sumitomo Wiring Systems, Ltd., Yokkaichi, Mie (JP)

(72) Inventor: Arinobu Nakamura, Mie (JP)

(73) Assignee: Sumitomo Wiring Systems, Ltd, Yokkaichi, Mie (JP)

( * ) Notice: Subject to any disclaimer, the term of this patent is extended or adjusted under 35 U.S.C. 154(b) by 0 days.

(21) Appl. No.: 15/024,395

(22) PCT Filed: Sep. 3, 2014

(86) PCT No.: PCT/JP2014/073242
§ 371 (c)(1),
(2) Date: Mar. 24, 2016

(87) PCT Pub. No.: WO2015/045768
PCT Pub. Date: Apr. 2, 2015

(65) Prior Publication Data
US 2016/0242275 A1 Aug. 18, 2016

(30) Foreign Application Priority Data
Sep. 24, 2013 (JP) .................................. 2013-196765

(51) Int. Cl.
*H05K 3/38* (2006.01)
*H05K 1/02* (2006.01)
*H05K 1/11* (2006.01)

(52) U.S. Cl.
CPC ........... *H05K 1/0263* (2013.01); *H05K 1/115* (2013.01); *H05K 3/386* (2013.01); *H05K 2201/10272* (2013.01)

(58) Field of Classification Search
CPC ....... H05K 1/0263; H05K 2201/10272; H05K 3/386; H02G 5/00; H02G 5/005; H02G 5/007; H02G 5/025
See application file for complete search history.

(56) References Cited

U.S. PATENT DOCUMENTS 7,167,377 B2    1/2007 Onizuka et al.
7,203,073 B2 *  4/2007 Kawakita ............. H05K 1/0263
                                                          361/775
(Continued)

FOREIGN PATENT DOCUMENTS

JP    06-006928 A    1/1994
JP    2003-164039 A  6/2003
(Continued)

OTHER PUBLICATIONS

Supplementary European Search Report for EP 14 84 8339 dated Aug. 31, 2016.

*Primary Examiner* — Hoa C Nguyen
(74) *Attorney, Agent, or Firm* — Dinsmore & Shohl LLP (57) ABSTRACT

Provided is a circuit assembly having a new structure in which a busbar circuit unit overlapped with a printed circuit board can reliably be fixed regardless of the heating temperature at the time of soldering of an electrical component. In a circuit assembly in which a busbar circuit unit constituted by a plurality of busbars is overlapped with a printed circuit board having a printed wiring and is fixed thereto via an adhesive sheet, the plurality of busbars are adhered to the surface of the adhesive sheet in a state in which the busbars are arranged adjacently and spaced apart by gaps, and the gaps between the busbars are filled with the adhesive agent. With the adhesive agent, press-cut surfaces of the busbars and at least one of the adhesive sheet and the printed circuit board that is exposed from the gaps between the busbars is adhered.

3 Claims, 7 Drawing Sheets

(56) References Cited

U.S. PATENT DOCUMENTS

| | | | |
|---|---|---|---|
| 2007/0086152 A1 | 4/2007 | Sasaki et al. | |
| 2008/0160754 A1* | 7/2008 | Fitzsimmons | H01L 21/02063 438/626 |
| 2012/0292094 A1* | 11/2012 | Jinagama | H05K 1/0203 174/268 |

FOREIGN PATENT DOCUMENTS

| | | |
|---|---|---|
| JP | 2004-248446 A | 9/2004 |
| JP | 2006-203977 A | 8/2006 |
| JP | 2007-135385 A | 5/2007 |
| JP | 2007-306672 A | 11/2007 |

* cited by examiner

CIRCUIT ASSEMBLY

CROSS-REFERENCE TO RELATED APPLICATIONS

This application is the U.S. national stage of PCT/JP2014/073242 filed Sep. 3, 2014, which claims priority of Japanese Patent Application No. JP2013-196765 filed Sep. 24, 2013.

FIELD OF THE INVENTION

The present invention relates to a circuit assembly in which a busbar circuit unit constituted by a plurality of busbars is overlapped with a printed circuit board and is fixed thereto via an adhesive sheet.

BACKGROUND OF THE INVENTION

Conventionally, circuit assemblies that include a composite arrangement of a printed circuit board serving as a control circuit and a busbar circuit unit that is constituted by a plurality of busbars and serves as a large current circuit are known as a circuit assembly that is to be accommodated in an electrical junction box of an automobile. Particularly in recent years, a circuit assembly, as disclosed in JP 2003-164039A (Patent Document 1), that has a structure in which busbars constituting a busbar circuit unit are directly fixed to a surface of a printed circuit board via an adhesive sheet has been proposed, in order to achieve downsizing and space-saving of the electrical junction box.

Terminal sections of electrical components such as a relay and a switch are connected to and mounted on printed wirings of the printed circuit board and the busbars of the busbar circuit unit of such a circuit assembly by soldering such as reflow soldering.

However, the circuit assembly having the conventional structure has the problem that in the process of mounting the electrical components by soldering, adhesion between the busbars and the printed circuit board by the adhesive layer cannot be maintained. Specifically, in recent soldering processes using lead-free solder, the heating temperature in the reflow furnace at the time of soldering needs to be higher than that in the case of conventional eutectic soldering, and may be higher than the melting temperature of plated layers such as tin plating applied to the surface of the busbars. In this case, there is the risk that due to the melting of the plated layer, the adhesion between the adhesive layer and the busbars is not maintained and the busbars are removed or separated from the printed circuit board.

Meanwhile, JP 2007-306672A (Patent Document 2) proposes that plated layers of busbars are made of nickel that has the melting temperature higher than the heating temperature of a reflow furnace. Although this measure indeed solves the problem that the plated layers of the busbars are melted due to the heating temperature at the time of soldering and the adhesion between the plated layers and the adhesive layer is damaged, the nickel-plated terminal sections of the busbars inevitably have a high hardness. Accordingly, if a plated layer of a counterpart terminal that is connected to the nickel-plated terminal section is plated with, for example, tin, which has a lower hardness than nickel, there will be the risk that a new problem may be caused that due to sliding of the contact surfaces of both terminals with respect to each other, the plated layer having a lower hardness wears and the contact resistance increases.

SUMMARY OF THE INVENTION

The present invention was made in view of the above-described circumstances, and its object to be solved is to provide a circuit assembly that has a new structure in which a busbar circuit unit that is overlapped with a printed circuit board can reliably be fixed thereto regardless of the heating temperature at the time of soldering of an electrical component.

According to a first aspect of the present invention, a circuit assembly is such that a busbar circuit unit constituted by a plurality of busbars is overlapped with a printed circuit board that has a printed wiring, the busbar circuit unit being fixed to the printed circuit board via an adhesive sheet, wherein the plurality of busbars are adhered to the adhesive sheet in a state in which the busbars are arranged adjacently and spaced apart by gaps, the gaps between the busbars are filled with an adhesive agent, and press-cut surfaces of the busbars and at least one of the adhesive sheet and the printed circuit board that is exposed from the gaps between the busbars are adhered to each other with the adhesive agent.

According to this aspect, the gaps between the busbars that are arranged adjacently and spaced apart by gaps on the adhesive sheet are filled with an adhesive agent, and the press-cut surfaces of the busbars and the adhesive sheet or the printed circuit board that is exposed from the gaps between the busbars are adhered to each other with the adhesive agent. Accordingly, even if an electrical component is soldered to the circuit assembly, the surface plating of the busbars is melted and adhesion between the surface of the busbars and the adhesive sheet is not maintained, adhesion between the busbars and the adhesive sheet and/or the printed circuit board by the adhesive agent is maintained, and thus fixation between the busbar circuit unit and the printed circuit board can be held.

Specifically, since originally plating of the press-cut surfaces of the busbar (side surfaces of the busbar) to which the adhesive agent is adhered is broken and the base material is exposed, the adhesion between the press-cut surfaces of the busbars and the adhesive agent is not affected by heat exposure during soldering. Furthermore, since the adhesive sheet and the printed circuit board to which the adhesive agent is to be adhered are also not provided with plating that is to be melted when being heated at the time of soldering, the adhesion between the adhesive agent and them is not affected by heat exposure during soldering. Therefore, by a very simple configuration in which the gaps between the adjacent busbars are filled with the adhesive agent, it is possible to solve the problem that the busbar circuit unit is removed from the printed circuit board due to heating at the time of soldering.

Particularly, since the adhesion between the press-cut surfaces of the busbars and the adhesive sheet and/or the printed circuit board by the adhesive agent is not affected by heat exposure during soldering, it is not necessary to change the type of the plating on the surface of the busbars depending on the heating temperature at the time of soldering, improving the degree of freedom of selection for the plating of the busbars. For example, even if an electronic component is mounted on the circuit assembly by reflow soldering using lead-free solder, the busbars can be plated with tin, which has a lower melting temperature than the lead-free solder.

Note that any adhesive agent may be used as long as it is heat resistance so as to withstand heat exposure during soldering, and a thermosetting adhesive agent of an epoxy system, a heat-resistant photo-curable adhesive agent of, for example, an UV curing type, or the like is suitably used.

According to a second aspect of the present invention, the circuit assembly according to the first aspect is such that the adhesive sheet that is exposed by the gaps between the busbars has a through-hole, the printed circuit board is exposed through the through-hole, and the press-cut surfaces of the busbars and the printed circuit board are directly adhered to each other with the adhesive agent.

According to the this aspect, since the adhesive agent can directly be fixed to the printed circuit board that is harder than the adhesive sheet, it is possible to make the fixation between the busbars and the printed circuit board by the adhesive agent more reliable.

According to a third aspect of the present invention, the circuit assembly according to the first or second aspect is such that the printed circuit board and the adhesive sheet respectively have through-holes at corresponding positions, and a soldering section of the busbars is exposed to a mounting surface of the printed circuit board through the through-holes.

According to this aspect, an electrical component can easily be soldered to the printed wiring of the printed circuit board and the busbar of the busbar circuit unit by reflow soldering, achieving simplification of the manufacturing process. Moreover, removal of the printed circuit board from the busbar circuit unit due to a heating temperature in a reflow furnace is advantageously prevented.

According to a forth aspect of the present invention, the circuit assembly according to any one of the first to third aspects is such that the adhesive agent is a photo-curable adhesive agent.

According to this aspect, it is possible to immediately realize fixation between the press-cut surfaces of the busbars and the adhesive sheet and/or the printed circuit board using the adhesive agent, achieving a reduction in working time. Furthermore, since curing is realized by emitting UV (ultraviolet), handling is easier than the case of a thermosetting adhesive agent that is heated to be cured, or a two-component adhesive agent in which curing is realized by a chemical reaction of a main agent and a curing agent, achieving simplification of the operation.

According to the present invention, since the press-cut surfaces of the busbars and the adhesive sheet or the printed circuit board that is exposed from the gaps between the busbars are adhered to each other with the adhesive agent, even if the surface plating of the busbars is melted at the time of soldering an electrical component, adhesion between the busbars and the adhesive sheet and/or the printed circuit board by the adhesive agent is maintained, and thus fixation between the busbar circuit unit and the printed circuit board can be held. In other words, the press-cut surfaces of the busbars to which the adhesive agent is adhered and the adhesive sheet and/or the printed circuit board are not provided with plating that is to be melted when being heated at the time of soldering, and thus are not affected by heating at the time of soldering. Therefore, it is not necessary to change the type of the plating on the surface of the busbars depending on the heating temperature at the time of soldering, improving the degree of freedom of selection for the plating of the busbars.

DETAILED DESCRIPTION OF THE PREFERRED EMBODIMENTS

Hereinafter, embodiments of the present invention will be described with reference to the drawings.

Figure 1:
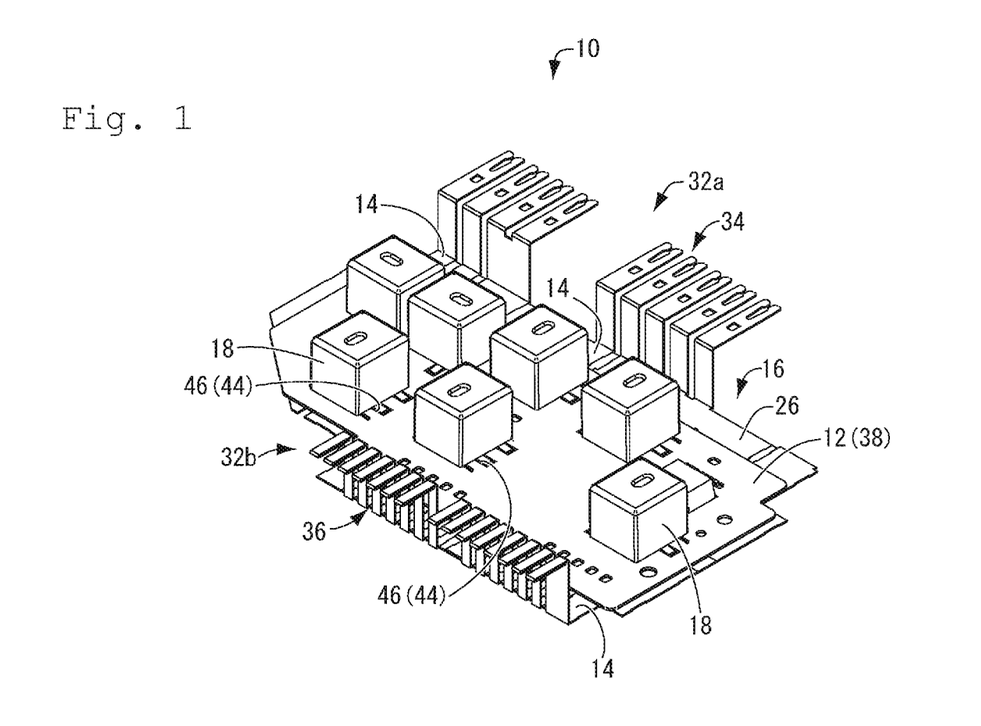
FIG. 1 is a perspective view illustrating a circuit assembly serving as an embodiment of the present invention.
Figure 2:
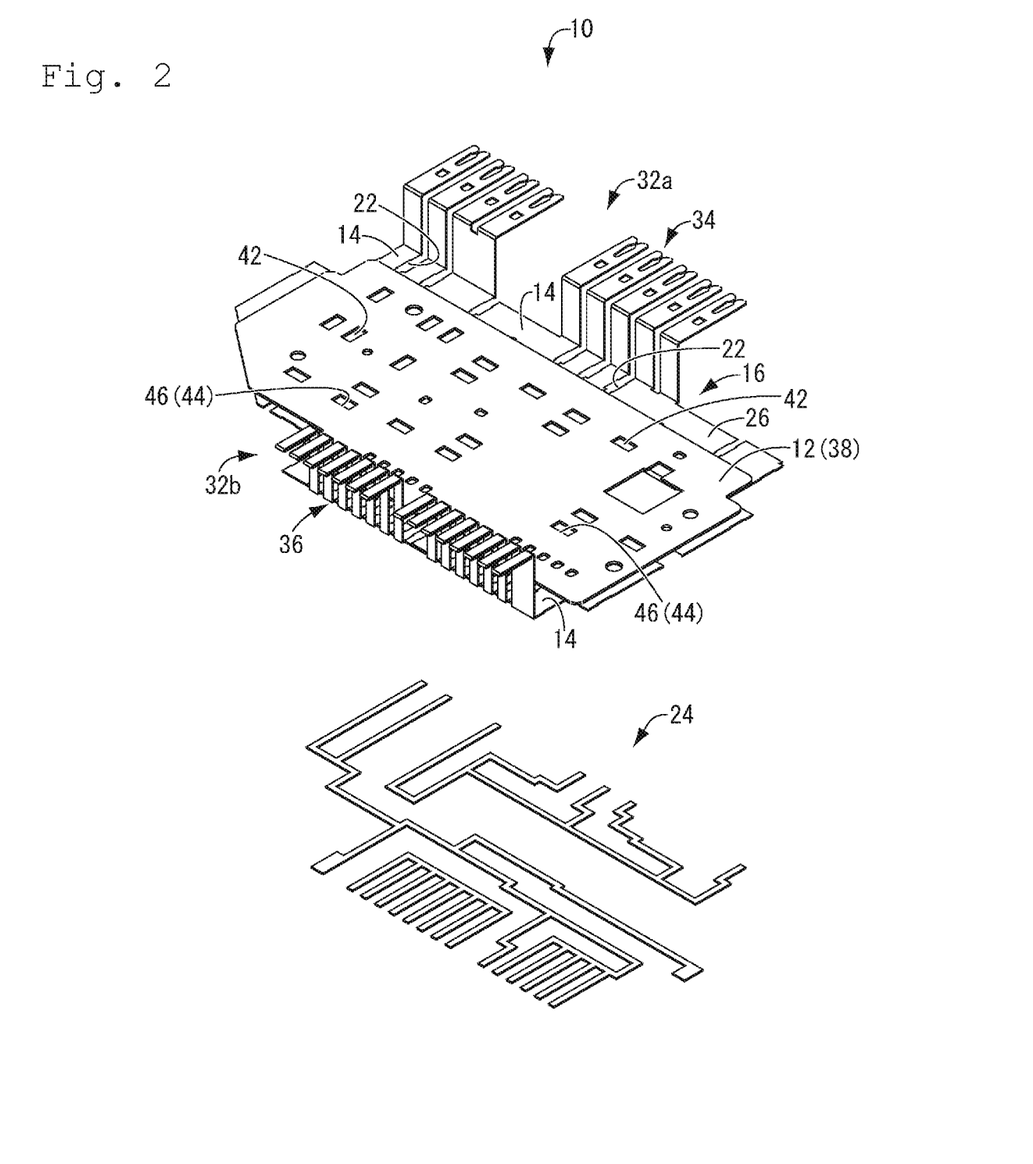
FIG. 2 is an exploded perspective view of the circuit assembly (not including an electrical component) that is shown in FIG. 1.
Figure 3:
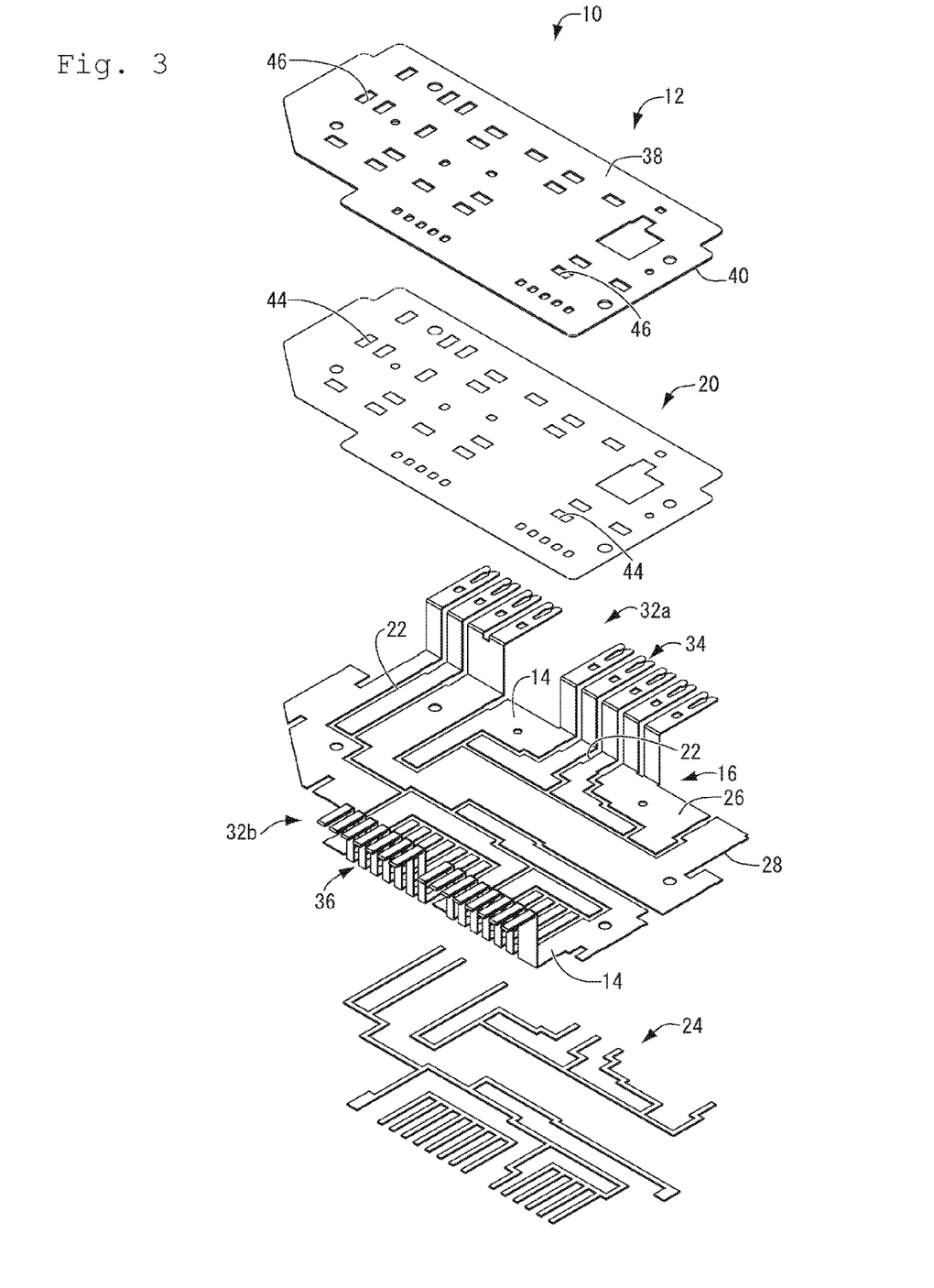
FIG. 3 is another exploded perspective view of the circuit assembly shown in FIG. 2.
Figure 4:
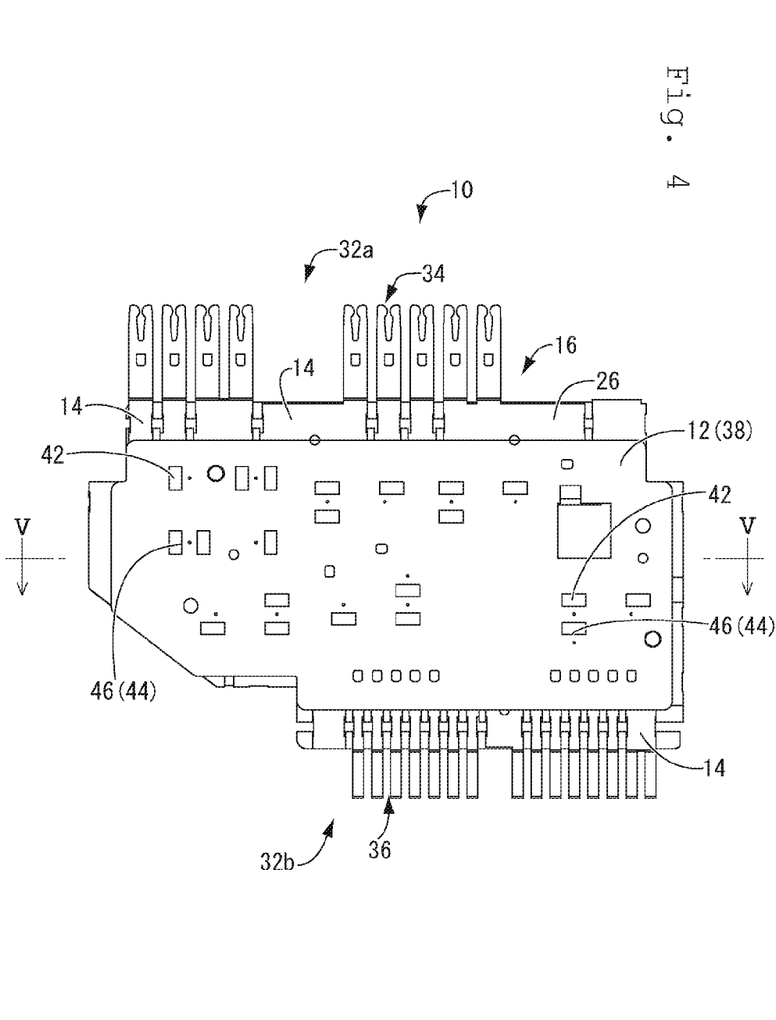
FIG. 4 is a plan view of the circuit assembly (not including an electrical component) that is shown in FIG. 1.

First, FIGS. 1 to 6 show a circuit assembly 10 serving as an embodiment of the present invention. As shown in FIGS. 1 to 3, the circuit assembly 10 includes a printed circuit board 12 having printed wirings that are not shown, and a busbar circuit unit 16 that is constituted by a plurality of busbars 14. The circuit assembly 10 is constituted by the printed circuit board 12 on which electrical components 18 such as relays are mounted being overlapped with and fixed to the busbar circuit unit 16 via an adhesive sheet 20 from the upper side, and gaps 22 between busbars 14 being filled with an adhesive agent 24 from the lower side. Note that in the following description, unless otherwise noted, "upper side" refers to the upper side of FIG. 1 in which the printed circuit board 12 is located, and "lower side" refers to the lower side of FIG. 1 in which the busbar circuit unit 16 is located.

Figure 5:
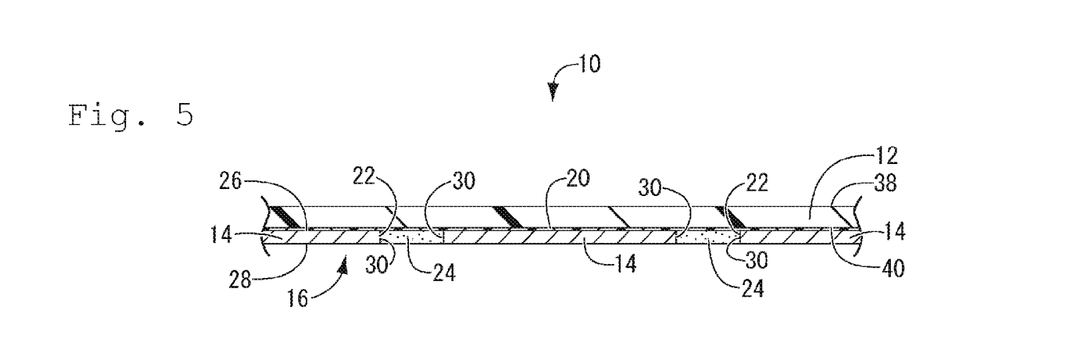
FIG. 5 is an enlarged view of a main part taken along the cross-section V-V of FIG. 4.

As shown in FIG. 3, the busbar circuit unit 16 has a configuration in which the plurality of busbars 14 are arranged adjacently and space apart by the gaps 22, and is formed by a conductive metal plate having a plated surface being pressed, punched, and bent by conventionally known means. Accordingly, as shown in FIG. 5, a front surface 26 and a rear surface 28 of the busbars 14 maintain the state of being plated, whereas press-cut surfaces 30 (see FIG. 5) formed at both ends of each busbar 14 in the width direction are in the state of being unplated such that the plating of the surfaces is removed at the time of pressing and punching.

The busbar circuit unit 16 has two ends 32*a* and 32*b* in its width direction, and at one end 32*a* (at the rear of FIG. 3), ends of the plurality of busbars 14 are bent in the shape of a crank and their tips are tuning fork-shaped, forming a fuse connection terminal section 34 into which connection sections of electrical components such as, for example, fuses that are not shown are inserted for connection. On the other hand, at the other end 32*b* (at the front of FIG. 3), ends of the plurality of busbars 14 are similarly bent in the shape of a crank, forming a connector connection terminal section 36 that is to be inserted into, for example, a not-shown connector housing and serves as a connector terminal fitting.

The printed circuit board 12 is overlapped with the busbar circuit unit 16 having such a configuration and is fixed thereto via the adhesive sheet 20 (see the upper part of FIG. 2). Specifically, a surface 40 of the printed circuit board 12 that is opposite to a mounting surface 38 on which the electrical components 18 are to be mounted, and the front surface 26 of the plurality of busbars 14 constituting the busbar circuit unit 16 are adhered to the adhesive sheet 20.

As shown in FIG. 3, the adhesive sheet 20 is formed so as to be slightly smaller than the busbar circuit unit 16, and has a plurality of through-holes 44 at positions that correspond to soldering sections 42 that are used for mounting terminal sections 50 of the electrical components 18 that will be described later. Note that the adhesive sheet 20 is made of a resin sheet that has both surfaces applied with a well-known adhesive agent such as, for example, an epoxy resin.

On the other hand, as shown in FIG. 3, the printed circuit board 12 has substantially the same shape as that of the adhesive sheet 20, and has through-holes 46 at positions corresponding to the soldering sections 42 of the busbar circuit unit 16. Accordingly, the soldering sections 42 (see FIG. 4) for the busbars 14 are exposed on the mounting surface 38 of the printed circuit board 12 via the through-holes 44 and 46.

Then, the gaps 22 between the busbars 14 of the busbar circuit unit 16 to which the printed circuit board 12 is fixed in the above-described manner are filled with the adhesive agent 24. Specifically, the gaps 22 between the busbars 14 are filled with a heat-resistant adhesive agent 24 of, for example, an UV (ultraviolet) curing type by a method such as screen printing. Using a not-shown UV (ultraviolet) irradiation device, the rear surface 28 of the busbar circuit unit 16 is irradiated with UV (ultraviolet), and the adhesive agent 24 is cured. Accordingly, as shown in FIG. 5, the press-cut surfaces 30 formed at the two ends of the busbars 14 in the width direction (horizontal direction of FIG. 5) and the adhesive sheet 20 that is exposed from the gap 22 between the busbars 14 are adhered to each other with the adhesive agent 24. Note that for ease of understanding, FIGS. 2 and 3 show the adhesive agent 24 after it is inserted into the gaps 22 between the busbars 14 and cured.

Accordingly, using the adhesive agent 24 of the UV (ultraviolet) curing type, it is possible to immediately realize adhesion between the press-cut surfaces 30 of the busbars 14 and the adhesive sheet by the adhesive agent 24, achieving a reduction in working time. Furthermore, since curing is realized by emitting UV (ultraviolet), handling is easier than the case of a thermosetting adhesive agent that needs to be heated or a two-component adhesive agent in which curing is realized by a chemical reaction of a main agent and a curing agent, achieving simplification of the operation.

Figure 6:
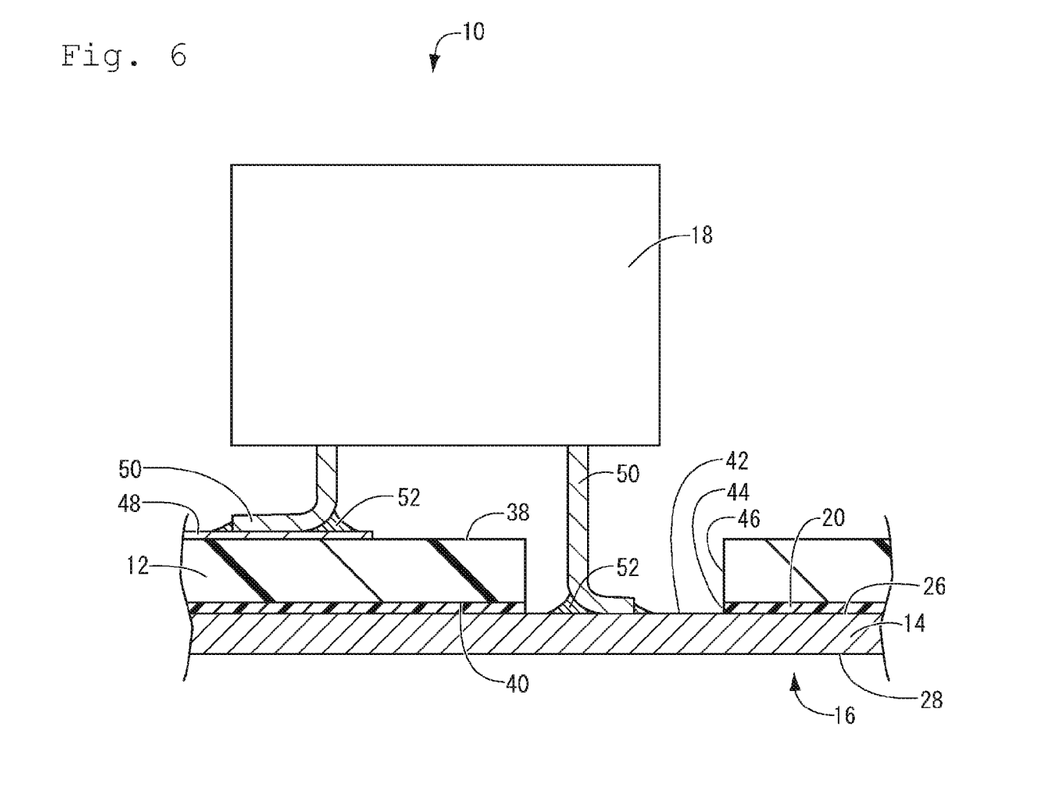
FIG. 6 is an enlarged cross-sectional view schematically illustrating a part of the circuit assembly shown in FIG. 1.

Lastly, in the circuit assembly 10 having such a configuration, the terminal sections 50 of the electrical components 18 are mounted to the printed wiring 48 of the printed circuit board 12 and the soldering section 42 of the busbar circuit unit 16 by reflow soldering using lead-free solder 52 or the like (see FIG. 6). Accordingly, since the electrical components 18 can easily be soldered to the printed wiring 48 of the printed circuit board 12 and the busbar 14 of the busbar circuit unit 16 by reflow soldering, the manufacturing process can be simplified.

Here, a tie-bar cutting process for cutting a tie-bar (not shown) that temporarily bundles the plurality of busbars 14, and a bending process for bending the ends of the busbars 14 to form the fuse connection terminal section 34 and the connector connection terminal section 36 are performed after the reflow soldering in the present embodiment, but may be performed before the reflow soldering. Note that for ease of understanding, in all the figures, the busbars 14 are shown in the state of having been completely subjected to the tie-bar cutting and the bending process.

According to the circuit assembly 10 of the present embodiment having such a configuration, even if when the electrical component 18 is soldered to the circuit assembly 10, the surface plating of the busbars 14 is melted and the adhesion between the front surface 26 of the busbars 14 and the adhesive sheet 20 is not maintained, adhesion between the busbars 14 and the adhesive sheet 20 by the adhesive agent 24 is maintained, and thus fixation between the busbar circuit unit 16 and the printed circuit board 12 can be held.

In other words, since the press-cut surfaces 30 of the busbars 14 to which the adhesive agent 24 is to be adhered are originally not plated, the adhesion between the press-cut surfaces 30 of the busbars 14 and the adhesive agent 24 is not affected by heating at the time of soldering. Furthermore, since the adhesive sheet 20 and the printed circuit board 12 to which the adhesive agent 24 is to be adhered are also not provided with plating that is to be melted when being heated at the time of soldering, the adhesion between the adhesive agent 24 and them is not affected by heating at the time of soldering. Therefore, it is possible to solve the problem that the busbar circuit unit 16 is removed from the printed circuit board 12 due to heating at the time of soldering.

Accordingly, since the adhesion between the press-cut surfaces 30 of the busbars 14 and the adhesive sheet 20 with the adhesive agent 24 is not affected by heating at the time of soldering, it is not necessary to change the type of the surface plating of the busbars 14 depending on the heating temperature at the time of soldering, improving the degree of freedom of selection for plating of the busbar 14. In other words, even if the electrical components 18 are mounted on the circuit assembly 10 by reflow soldering using the lead-free solder 52, the busbars 14 can be plated with tin, which has a lower melting temperature than the lead-free solder 52.

Figure 7:
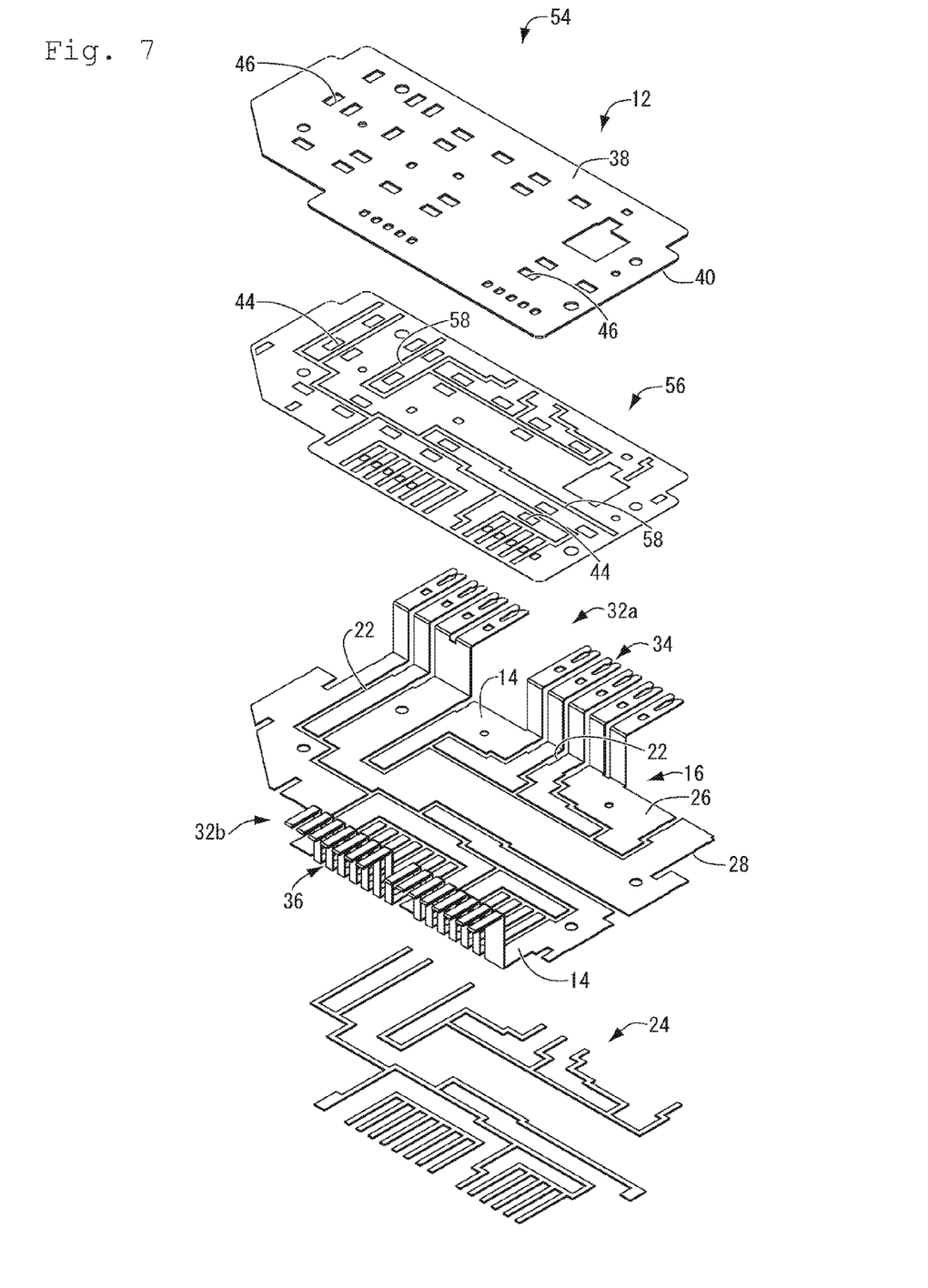
FIG. 7 is an exploded perspective view corresponding to FIG. 3, illustrating another aspect of an adhesive sheet for use in the circuit assembly of the present invention.
Figure 8:
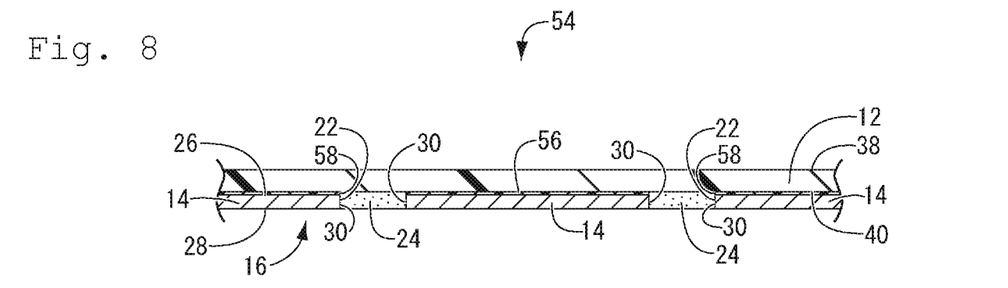
FIG. 8 is an enlarged cross-sectional view of a main part that corresponds to FIG. 5, illustrating a cross-section of the circuit assembly shown in FIG. 7 in the assembled state.

Hereinafter, another aspect of the adhesive sheet for use in the circuit assembly of the present invention will be described in detail with reference to FIGS. 7 and 8. The same reference numerals as those of the above-described embodiment are given to the same configurations in the figure as those of the above-described embodiment, and detailed descriptions thereof are omitted. In other words, a circuit assembly 54 indicates an embodiment different from the above-described embodiment in that an adhesive sheet 56 has through-holes 58 that correspond to not only the soldering sections 42 of the busbar circuit unit 16 but also the gaps 22 between the busbars 14. Specifically, as shown in FIG. 8, the printed circuit board 12 is exposed through the through-holes 58, and the press-cut surfaces 30 of the busbars 14 and the printed circuit board 12 are directly adhered to each other with the adhesive agent 24. Also in the circuit assembly 54 of the present embodiment, even if plating on the surfaces of the busbars 14 is melted, and the adhesion between the front surface 26 of the busbars 14 and the adhesive sheet 56 is not maintained, the busbars 14 and the printed circuit board 12 are adhered to each other with the adhesive agent 24, and thus the same effects as those of the circuit assembly 10 of the foregoing embodiment.

Furthermore, since the adhesive agent 24 can directly be fixed to the printed circuit board 12 that is harder than the adhesive sheet 56, it is possible to realize the fixation between the busbars 14 and the printed circuit board 12 by the adhesive agent 24 more reliably.

The details of the embodiments of the present invention have been described so far, but the present invention is not limited to the specific embodiments. For example, any adhesive agent 24 may be used as long as it has a resistance against heating at the time of soldering, and a heat-resistant photo-curable adhesive agent of, for example, an UV curing type that is exemplified in the present embodiments, a thermosetting adhesive agent of an epoxy system, or the like is suitably used. Note that the adhesive sheets 20 and 56 may be cohesive sheets such as highly heat-resistant double-faced tapes.

The invention claimed is:

1. A circuit assembly comprising:
   a busbar circuit unit constituted by a plurality of busbars each having an undersurface; a printed circuit board that has a printed wiring, the busbar circuit unit overlapping a printed circuit, the busbar circuit unit being fixed to the printed circuit board via an adhesive sheet,
   wherein undersurface of each of the plurality of busbars are adhered to the adhesive sheet in a state in which the busbars are arranged adjacently and spaced apart by gaps, wherein the adhesive sheet that is exposed from the gaps between the busbars has a through-hole;
   an adhesive agent, the adhesive agent being different than the adhesive sheet the gaps between the busbars, and press-cut surfaces of the busbars and at least one of the adhesive sheet and the printed circuit board that is exposed from the gaps between the busbars are adhered to each other with the adhesive agent, wherein the printed circuit board is exposed through the through-hole and the press-cut surfaces of the busbars and the printed circuit board are directly adhered to each other with the adhesive agent.

2. The circuit assembly according to claim 1, wherein the printed circuit board and the adhesive sheet respectively have through-holes at corresponding positions, and a soldering section of the busbars is exposed to a mounting surface of the printed circuit board through the through-holes.

3. The circuit assembly according to claim 1, wherein the adhesive agent is a photo-curable adhesive agent.

* * * * *